United States Patent
Waag et al.

(10) Patent No.: US 8,703,587 B2
(45) Date of Patent: Apr. 22, 2014

(54) METHOD OF MANUFACTURING OF A SEMI-CONDUCTOR ELEMENT AND SEMI-CONDUCTOR ELEMENT

(75) Inventors: Andreas Waag, Braunschweig (DE); Xue Wang, Braunschweig (DE); Shunfeng Li, Braunschweig (DE)

(73) Assignee: Technische Universitaet Braunschweig Carolo-Wilhelmina, Braunschweig (DE)

( * ) Notice: Subject to any disclaimer, the term of this patent is extended or adjusted under 35 U.S.C. 154(b) by 24 days.

(21) Appl. No.: 13/549,391

(22) Filed: Jul. 13, 2012

(65) Prior Publication Data
US 2013/0015426 A1  Jan. 17, 2013

Related U.S. Application Data

(60) Provisional application No. 61/508,342, filed on Jul. 15, 2011.

(51) Int. Cl.
*H01L 21/20* (2006.01)
(52) U.S. Cl.
USPC ............. 438/478; 438/479; 257/13; 257/192; 257/E21.09; 257/E21.108
(58) Field of Classification Search
USPC ................ 438/46, 47, 478, 479; 257/13, 192, 257/E21.09, E21.108
See application file for complete search history.

(56) References Cited

U.S. PATENT DOCUMENTS

| | | | |
|---|---|---|---|
| 8,148,244 B2 * | 4/2012 | Baker et al. | 438/481 |
| 2009/0068411 A1 | 3/2009 | Hong et al. | |
| 2010/0276664 A1 | 11/2010 | Hersee | |

OTHER PUBLICATIONS

Chen X et al: "Homoepitaxial growth of catalyst-free GaN wires on N-polar substrates", Applied Physics Letters, AIP, American Institute of Physics, Melville, NY, US, vol. 97, No. 15, Oct. 13, 2010, pp. 151909-151909, XP012137241.
S. F Li et al: "Polarity and Its Influence on Growth Mechanism during MOVPE Growth of GaN Sub-micrometer Rods", Crystal Growth & Design, vol. 11, No. 5, May 4, 2011, pp. 1573-1577, XP55013312.
EPO Search Report for related European Application No. 11005626. 4-2203; Dec. 5, 2011.

* cited by examiner

*Primary Examiner* — David Vu

(57) ABSTRACT

A method of manufacturing of a semi-conductor element, comprising the following steps: providing a substrate, the substrate having a surface, the surface being partially coated with a coating and having at least one uncoated area, and growing a truncated pyramid of gallium nitride on the uncoated area, wherein the method comprises the following step: growing at least one gallium nitride column on the truncated pyramid.

6 Claims, 3 Drawing Sheets

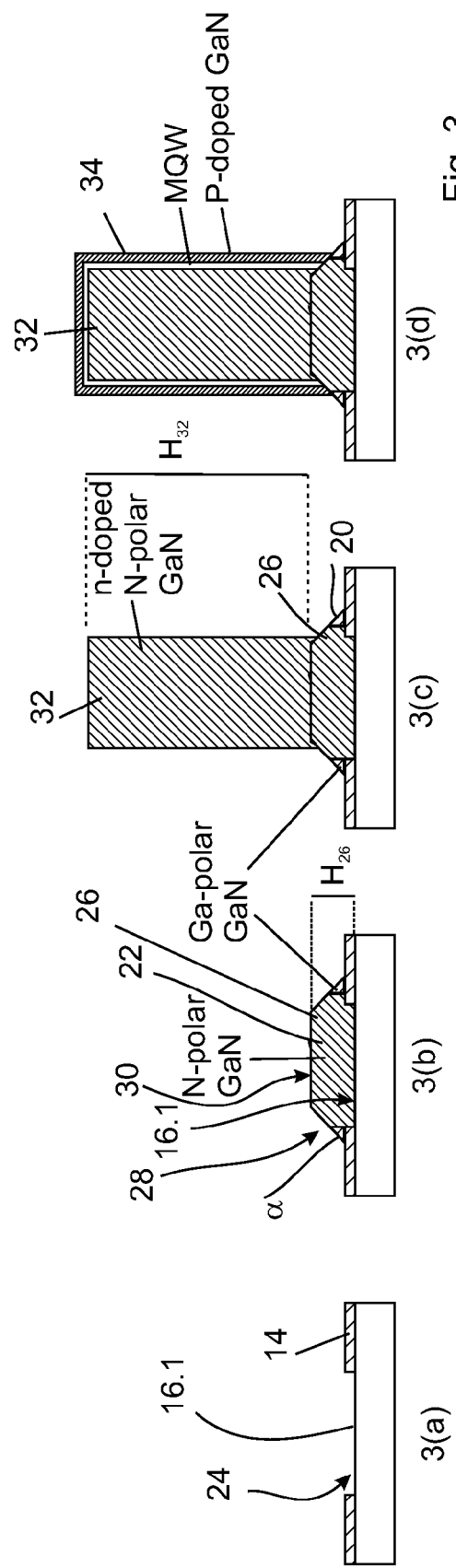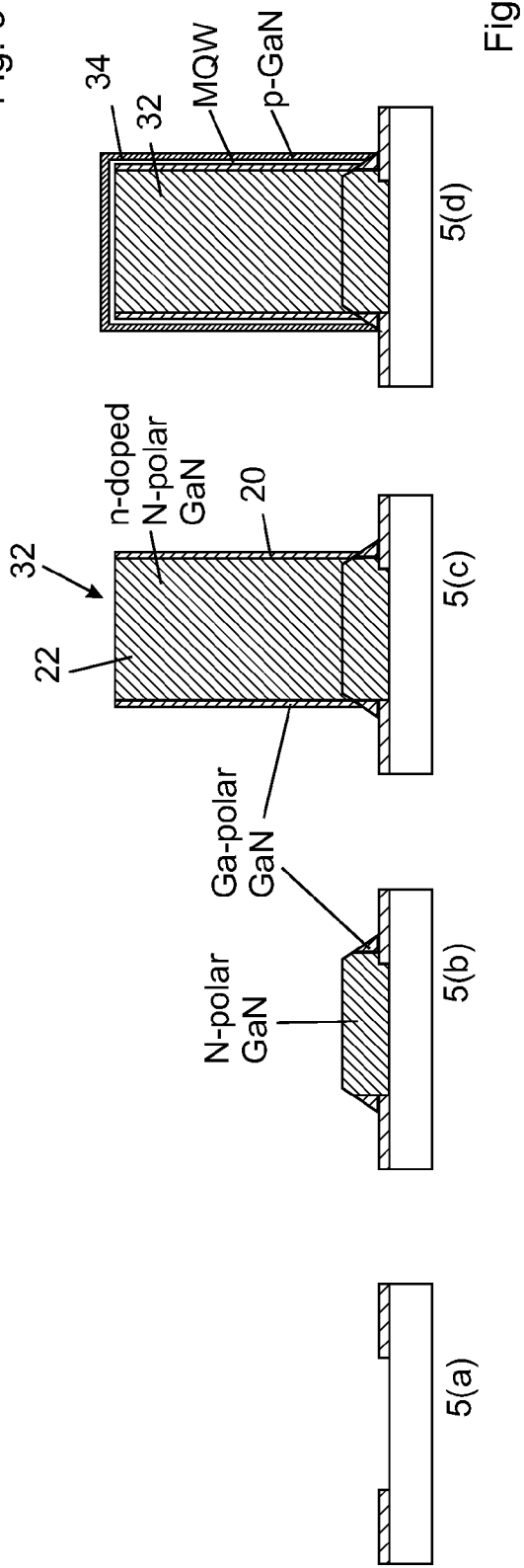

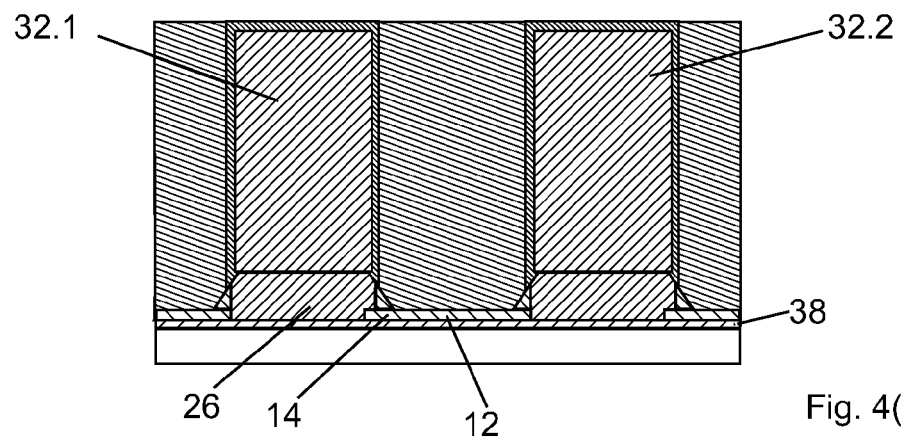
Fig. 4(a)
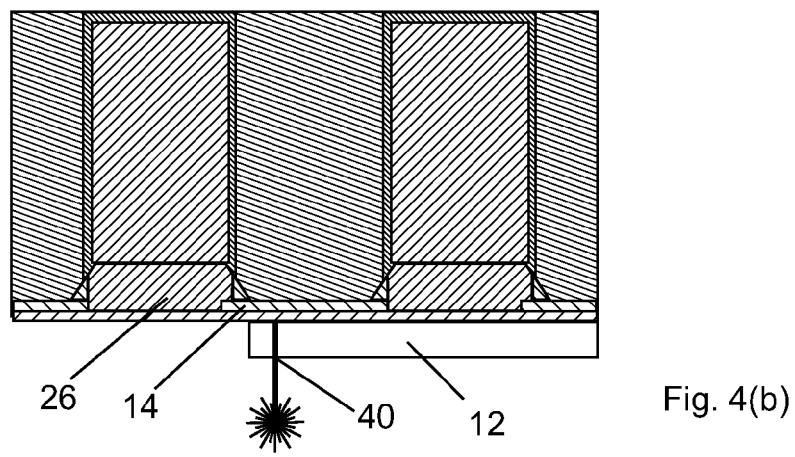
Fig. 4(b)
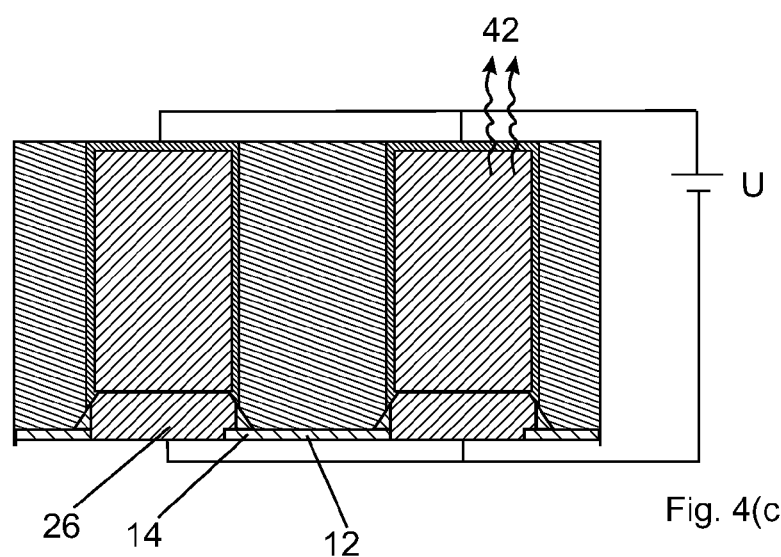
Fig. 4(c)
Fig. 4

METHOD OF MANUFACTURING OF A SEMI-CONDUCTOR ELEMENT AND SEMI-CONDUCTOR ELEMENT

This non-provisional application claims the benefit of U.S. Provisional Patent Application 61/508,342, filed on Jul. 15, 2011, which is incorporated herein by reference.

BACKGROUND AND SUMMARY

A semi-conductor element may be a light emitting diode (LED) that is used for converting electrical energy into light energy. Two major parameters for light emitting diodes are the light intensity, which is the amount of optical power emitted per area, and the efficiency, which is the ratio of emitted optical power to the electrical power used by the device.

To produce blue or white light, gallium nitride light emitting diodes are frequently used. It is known that nanorods and microrods which have a core shell p-n-junction can be used to increase the active area of an LED. However, the efficiency of this kind of LEDs, presently is rather low.

The invention aims at increasing the efficiency and performance of gallium nitride semi-conductor elements, such as gallium nitride light emitting diodes, gallium nitride transistors, gallium nitride thyristors, etc.

The invention solves the problem by a method manufacturing of a semi-conductor element, and a semi-conductor element, as claimed in the appended claims.

Disclosed herein is a method of manufacturing of a semi-conductor element, comprising the following steps: (a) providing a substrate having a surface, the surface being partially coated with a coating and having at least one uncoated area, (b) growing a truncated pyramid of gallium nitride on the uncoated area, (c) growing at least one gallium nitride column on the truncated pyramid, (d) the step of growing the truncated pyramid is carried out such that the ratio of the area of the Ga-polar gallium nitride on the top surface of the truncated pyramid to the area of the N-polar region on the top surface of the truncated pyramid is decreasing with time, and (e) the growing of the truncated pyramid is stopped at a time when a top surface of the truncated pyramid is only N-polar.

Also disclosed is a semi-conductor element, in particular a LED, comprising (i) a substrate having a surface, (ii) a coating partially covering the surface, (iii) the surface having at least one uncoated area, and (iv) a truncated pyramid of gallium nitride on the uncoated area.

It is an advantage of the present invention that it increases the efficiency and performance of the semi-conductor element. With the prior art methods the middle part of a gallium nitride column grows on uncoated area of the substrate and also a part of the column grows on the coated substrate, which leads to a mixed-polarity growth. Mixed polarity means that some of the GaN-material grows in a N-polar c-direction and some other GaN-material grows in a Ga-polar c-direction. Therefore there are polarity inversion boundaries and dislocations which tend to scatter and absorb photons, thus reducing the efficiency of the light emitting diode as well as reducing transistor functions. With the new method, a gallium nitride column grown on a truncated pyramid leads to single polar gallium nitride column. The amount of polarity inversion boundaries and dislocations will be strongly reduced; therefore e.g. the light scattering and absorption in gallium nitride columns will also be reduced.

The method comprises the steps of (i) coating the substrate with the coating, (ii) transferring a pattern for the uncoated areas via lithography, for example photolithography or nanoimprint lithography, and (iii) etching, for example by inductively coupled plasma etching, the coating such that the surface of the substrate is partially coated with the coating and has at least one uncoated area. Techniques for coating, lithography and etching are generally known and not reproduced here.

The uncoated area may be hexagonal. The distance between two opposing sites of uncoated area may be between 100 nm to 50 μm. Generally, it is advantageous to have a small distance between two opposing sites, as this allows for increasing the density of uncoated areas and thus of gallium nitride columns, which increases the active surface of the semi-conductor element. However, the distance between two opposing sites must not be too small. If the p-doped GaN shell structure is grown on the n-doped GaN column (with or without a quantum well), a depletion region forms between the pn-junction. The diameter of the whole column should be larger than the width of the respective depletion region.

The pattern constant, i.e. the distance between geometrical centres of two uncoated areas may be between 200 nm to 50 μm.

In one embodiment, the truncated pyramid of gallium nitride on the uncoated area is grown in the crystallographic c-direction. That may be carried out in a 3×2" FT Thomas Swan MOVPE system at 125 hPa using a carrier gas in the reactor of 50% $N_2$ and 50% $H_2$. To the carrier gas flow, $NH_3$ and trimethygallium are added with a V/III ratio. The V/III ratio may be between 30 and 70, with 50 being the best value. The temperature may be T=960° C. This leads to a truncated pyramid having an angle between a ridge of the truncated pyramid and the substrate surface of about 58°. Depending on the growth time that may be between 100 and 260 seconds the height of the truncated pyramid may be between 100 nm and 400 nm.

The aspect ratio is the height of the gallium nitride column divided by the distance between two opposing sites of the gallium nitride columns. In certain alternatives, the aspect ratio is at least one.

It has been found that growing the truncated pyramid of gallium nitride and putting at least one gallium nitride column on top of the truncated pyramid can be carried out via metal organic vapor phase epitaxy (MOVPE).

The growth of the at least one gallium nitride column on the truncated pyramid may be carried out such that the gallium nitride column is only N-polar. Gallium nitride has a wurtzite type elementary cell. With respect to the crystallographic c-axis the gallium nitride elementary cell has an N-polar side and a Ga-polar side. Prior art methods lead to multi-polar gallium nitride crystals because when GaN is grown on this substrate, N-polar GaN will grow on the uncoated areas (or partly lateral over grow on the coated areas). Surrounding the N-polar GaN, Ga-polar GaN will grow on the coated area, due to the additional nucleation on the coating. The multi polar GaN columns have many polarity inversion boundaries between N-polar regions of the crystal and Ga-polar regions of the crystal. It has been found out that these polarity inversion boundaries cause absorption and scattering of light, thus reducing the efficiency.

In one alternative, growing of the truncated pyramid is carried out such that the part of the surface area of the GaN truncated pyramid which is covered by Ga-polar GaN crystals decreases to zero after a short growth time of truncated pyramid, the centre of the top surface of the GaN truncated pyramid being N-polar and the rim being Ga-polar. If we increase the growth time, the top surface area decreases with the increasing of the height of the truncated pyramid. The growth process is stopped when the top surface is covered just by N-polar GaN and the Ga-polar rim has disappeared. This can be achieved for example with the process parameters as described above. This method yields unipolar GaN column with a low dislocation density and high efficiency.

As an alternative, it is possible that the growth of the at least one gallium nitride column on the truncated pyramid is carried out such that the gallium nitride column has a N-polar core part and Ga-polar outer part surrounding the core part, the core part and the outer part contacting each other. This can be achieved by choosing a temperature between 1000° C. and 1040° C.

Alternatively or additionally, growing the at least one gallium nitride column on the truncated pyramid comprises n-doping the gallium nitride. For example, $SiH_4$ may be used as an n-doping precursor.

According to one embodiment, the method comprises the following steps: (i) growing an InGaN/GaN quantum well shell structure and/or a p-doped shell structure surrounding the gallium nitride column at least partially, wherein the polarity of the quantum well and/or the p-doped gallium nitride are the same to the polarity of the sidewalls of the n-doped gallium nitride column, (ii) contacting the gallium nitride column electrically, and contacting the shell structure electrically. This leads to a method of manufacturing a light emitting diode.

It is possible to provide a substrate having a plurality of uncoated areas. In this case it is advantageous to grow one truncated pyramid of gallium nitride on a plurality of uncoated areas, in particular on each uncoated area. This allows for mass production of LEDs or other semi-conductor elements.

The method may comprise the step of removing the substrate at least locally and contacting the gallium nitride column electrically from both sides. For example, it is possible to grow a conducting layer such as an n-doped N-polar GaN layer below the pyramid for better contacts.

In various embodiments, the temperature is below or equal to 980° C. during growing of the truncated pyramid of gallium nitride. It is also preferred to carry out the growth process of the gallium nitride column at a temperature above 1050° C.

In various embodiments, the coating is a silicon oxide ($SiO_x$) or silicon nitride ($SiN_x$) coating. The substrate may be sapphire. It is possible to carry out the silicon dioxide coating process by plasma enhanced chemical vapour deposition. The coating thickness may be between 30 nm and 50 nm.

For a semi-conductor element according to the present invention, the height of the truncated pyramid is preferably larger than 100 nm. It also preferred that the height of the truncated pyramid is less than 400 nm. A high efficiency is obtained with monocrystalline and single polar gallium nitride columns.

The top cross section of a truncated pyramid parallel to the substrate surface may be smaller than the uncoated area it has been grown on. In this case, the gallium nitride column is usually unipolar. The gallium nitride column may be N-polar.

Preferred embodiments of the invention will now be described with reference to the accompanying drawing, in which.

BRIEF DESCRIPTION OF THE DRAWINGS

FIG. 3 is a schematic overview of a method according to the present invention for growing a unipolar gallium nitride column, FIG. 4 depicts schematically additional steps in a method according to the present invention and FIG. 5 is a schematic overview of a second embodiment of the method according the present invention.

DETAILED DESCRIPTION OF THE DRAWINGS

Figure 1:
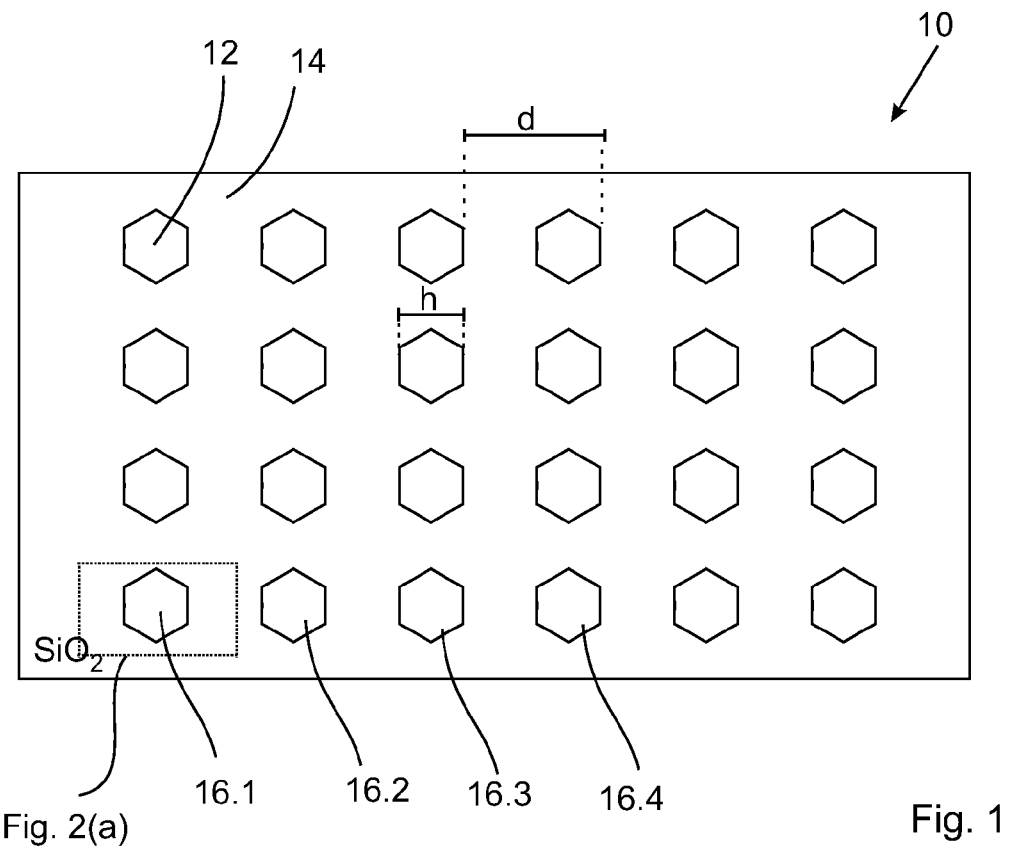
FIG. 1 is a schematic view of a semi-conductor element according to the present invention.

FIG. 1 shows a semi-conductor element 10 comprising a substrate 12 and a coating 14 partially covering a surface of substrate 12. The surface of the substrate 12 has a plurality of uncoated areas 16.1, 16.2, 16.3, ... that are no longer covered with the coating 14.

The substrate 12 is sapphire, i.e. $Al_2O_3$. In a first step, the coating 14, which is a $SiO_2$ layer, was deposited by plasma enhanced chemical vapour deposition (PECVD). The coating has a thickness of 30 nm to 50 nm. In a second step, photolithography was used to transfer the pattern of the now uncoated areas 16 onto the coated substrate 12, followed by inductively coupled plasma etching to open the uncoated areas 16 in the coating 14. Reference numerals without counting suffix relate to the object as such.

The pattern shown in FIG. 1 has a smallest distance d between two adjacent centres of uncoated areas. This smallest distance d may be between 100 nm to 50 nm. However, it is not necessary, that the smallest distance d and/or the distance between two opposing sites h is constant. It is possible to provide a pattern with varying distance d or even a randomly distributed pattern.

Figure 2:
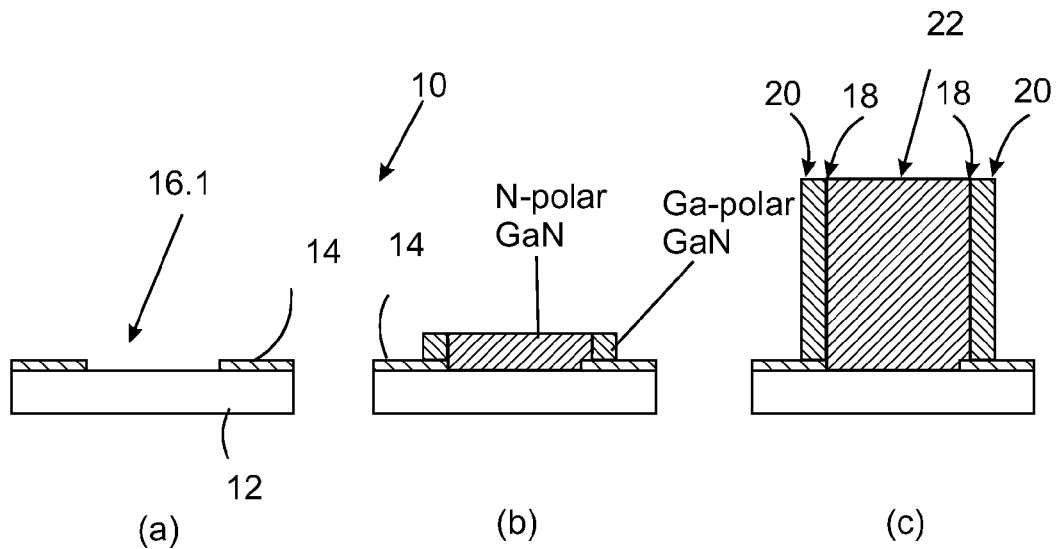
FIG. 2 is a schematic illustration of a method according to prior art.

FIG. 2(a) shows a partial cross section of the semi-conductor element 10 according to FIG. 1. When gallium nitride GaN is grown in this substrate, N-polar GaN will grow on the uncoated areas (or partly lateral over grow on the coated areas). Surrounding the N-polar GaN, Ga-polar GaN will grow on the coated area, due to the additional nucleation on the coating, as shown in FIG. 2(b).

FIG. 2(c) shows that a polarity inversion boundary 18 will form between an outer region 20 of Ga-polar GaN and an inner region 22 of N-polar GaN. It has been found out that this polarity inversion boundary may give rise to scattering and absorption of light, and hence a reduction of LED efficiency.

FIG. 3(a) shows a schematic diagram of a method according to the present invention. FIG. 3(a) depicts a first step of providing substrate 12, the substrate 12 having a surface 24 that is partially coated with a coating 14 and has at least the uncoated area 16.1.

FIG. 3(b) schematically shows a second step (b) of growing a truncated pyramid 26 of gallium nitride on the uncoated area 16.1. The growth process is carried out in a 3×2" FT Thomas Swan MOVPE system at 125 hPa using a carrier gas in the reactor of 50% $N_2$ and 50% $H_2$. To the carrier gas flow, $NH_3$ and trimethygallium (TMGa) are added with a V/III ratio of 50. The temperature is T=960° C. This leads to the truncated pyramid having an angle α between a ridge 28 of the truncated pyramid 26 and the substrate surface 24 of about 58°.

FIG. 3(c) shows that the truncated pyramid 26 has an inner region 26 made of N-polar GaN, as it grows on the uncoated area 16.1 of the substrate. The truncated pyramid 26 also has an outer region 20 made of Ga-polar GaN.

The growth process is stopped after Δt=100 seconds. A height $H_{26}$ of the truncated pyramid 26 depends on the diameter of the uncoated area. If, for example, the diameter of the uncoated area is 2 μm, the height $H_{26}$ is about 100 nm. The height $H_{26}$ increases with the decreasing of the diameter of the uncoated area. The growth time should be increased until the Ga-polarity ratio on the top surface of the truncated pyramid $P=A_{Ga}/A_N$ has decreased to 0, wherein $A_{Ga}$ is the area of the Ga-polar region on the top surface and $A_N$ is the area of the N-polar region on the top surface of the pyramid. As the growing process is stopped accordingly, a pyramid top surface 30 is N-unipolar.

The third step (c) is shown in FIG. 3(c) and comprises growth of a gallium nitride column 32 on the truncated pyramid 26. As the gallium nitride column 32 grows only on the N-polar inner region (22) of the truncated pyramid 26. For example, this can be achieved by growing the truncated pyramid 26 such that the top surface 30 is a crystallographic c-plane and by choosing the growth conditions such that the gallium nitride column grows preferably on this c-plane.

The gallium nitride column 32 has a very low imperfection density. Further, this imperfection density decreases with height $H_{32}$ of the gallium nitride column 32.

During the growth process of the gallium nitride column 32, $SiH_4$ is used as an n-doping precursor, so that the gallium nitride column 32 is of n-doped N-polar gallium nitride.

FIG. 3(d) depicts a subsequent step of growing an InGaN multi quantum well (MQW) on the surface of the gallium nitride column 32 and a p-doped shell structure 34 on top of it. The following process parameters may be chosen to grow the InGaN multi quantum well in the above mentioned 3×2" FT Thomas Swan MOVPE system:
  pressure: 400 hPa;
  carrier gas in the reactor: 100% $N_2$;
  $NH_3$ added: 5000 cubic centimetres per second;
  triethygallium (TEGa) added: 10 cubic centimetres per second;
  temperature T=720° C.; and
  time: 120 seconds.

The following process parameters may be chosen to grow the p-GaN shell in the above mentioned 3×2" FT Thomas Swan MOVPE system:
  pressure: 120 hPa;
  carrier gas in the reactor: 100% $H_2$;
  $NH_3$ added: 4200 cubic centimeters per second;
  trimethygallium (TMGa) added: 10 cubic centimeters per second;
  temperature T=1000° C.; and
  time: 700 seconds.

FIG. 4 shows a method to contact the gallium nitride column 32. In a first step shown in FIG. 4(a), spin-on-glass (SOG) is spun into the free space between the gallium nitride columns 32.1, 32.2, . . . in order to fix them relative to each other.

In a second step shown in FIG. 4(b) the substrate 12 is removed. This can be carried out by a laser 40. As an alternative, the substrate 12 is coated with a GaN auxiliary layer 38. This substrate is subsequently partially coated with the coating 14 and leaving the uncoated area 16 uncoated. A laser beam 40 is then used to remove the substrate in the way described below.

The laser beam has a wavelength that can be absorbed by GaN in the auxiliary layer 38, but not by the substrate 12. The GaN disintegrates into Ga and $N_2$, which expands rapidly and lifts off the substrate.

FIG. 4(c) shows the semi-conductor element in form of the light emitting diode. The p-doped shell structure and the inner region 22 of the gallium nitride column 32 are contacted. If a voltage U is applied to the metal layer and the shell structure 34, photons 42 are produced in the boundary zone between shell structure 34 and inner region 22.

FIG. 5 depicts an alternative method according to the present invention. FIG. 5(c) shows that the gallium nitride column 32 has an inner region 22 of n-doped N-polar gallium nitride and an outer region 20 of Ga-polar GaN.

FIG. 5(d) shows the situation that is comparable to FIG. 3(d) with the gallium nitride column 32 being coated with a p-doped shell structure 34 and an InGaN multi quantum well grown under conditions described above.

While the invention has been illustrated and described in detail in the drawings and foregoing description, the same is to be considered as illustrative and not restrictive in character, it being understood that only preferred embodiments have been shown and described and that all changes and modifications that come within the spirit of the invention are desired to be protected by the appended claims and the equivalents thereof.

Reference List 10 semi-conductor element
12 substrate
14 coating
16 uncoated area
18 polarity inversion boundary
20 outer region
22 inner region
24 surface
26 pyramid
28 ridge
30 pyramid top surface
32 gallium nitride column
34 shell structure
38 auxiliary layer
40 laser beam
42 photon
d distance pattern constant
h distance between two opposing sites
$H_{26}$ height of truncated pyramid
$H_{32}$ height of GaN column

What is claimed is:

1. A method of manufacturing of a semi-conductor element, comprising the following steps:
   (a) providing a substrate having a surface, the surface being partially coated with a coating and having at least one uncoated area,
   (b) growing a truncated pyramid of gallium nitride on the uncoated area,
   (c) growing at least one gallium nitride column on the truncated pyramid,
   (d) the step of growing the truncated pyramid is carried out such that the ratio of the area of the Ga-polar gallium nitride on the top surface of the truncated pyramid to the area of the N-polar region on the top surface of the truncated pyramid is decreasing with time, and
   (e) the growing of the truncated pyramid is stopped at a time when a top surface of the truncated pyramid is only N-polar.

2. The method according to claim 1, wherein
the step of growing the at least one gallium nitride column on the truncated pyramid comprises n-doping the gallium nitride.

3. The method according to claim 1, further comprising:
   (d) growing one or more structures at least partially surrounding the gallium nitride column selected from the group consisting of an InGaN/GaN quantum well shell structure, a p-doped shell structure, and an InGaN/GaN shell structure,
   (e) contacting the gallium nitride column electrically, and
   (f) contacting the shell structure electrically.

4. The method according to claim 1, wherein the step of growing the truncated pyramid of gallium nitride is carried out such that the gallium nitride column grows only on an N-polar inner region of the truncated pyramid.

5. The method according to claim 1, wherein the coating is a silicon oxide or a silicon nitride coating.

6. The method according to claim 1, wherein the substrate is sapphire.

* * * * *